(12) United States Patent
Tsubaki et al.

(10) Patent No.: US 10,610,905 B2
(45) Date of Patent: Apr. 7, 2020

(54) PURGE DEVICE, PURGE STOCKER, AND CLEANING METHOD

(71) Applicant: MURATA MACHINERY, LTD., Kyoto-shi, Kyoto (JP)

(72) Inventors: Tatsuo Tsubaki, Ise (JP); Masanao Murata, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 134 days.

(21) Appl. No.: 15/751,571

(22) PCT Filed: Jun. 13, 2016

(86) PCT No.: PCT/JP2016/067550
§ 371 (c)(1),
(2) Date: Feb. 9, 2018

(87) PCT Pub. No.: WO2017/026168
PCT Pub. Date: Feb. 16, 2017

(65) Prior Publication Data
US 2018/0229276 A1 Aug. 16, 2018

(30) Foreign Application Priority Data
Aug. 10, 2015 (JP) .................................. 2015-158043

(51) Int. Cl.
*B08B 5/02* (2006.01)
*H01L 21/673* (2006.01)
*B65G 1/00* (2006.01)
*H01L 21/677* (2006.01)
*B08B 9/08* (2006.01)

(52) U.S. Cl.
CPC .............. *B08B 5/02* (2013.01); *B08B 9/0826* (2013.01); *B65G 1/00* (2013.01); *H01L 21/673* (2013.01); *H01L 21/67389* (2013.01); *H01L 21/67393* (2013.01); *H01L 21/67733* (2013.01); *H01L 21/67769* (2013.01)

(58) Field of Classification Search
None
See application file for complete search history.

(56) References Cited

U.S. PATENT DOCUMENTS

| 2010/0000625 A1 | 1/2010 | Goto et al. |
| 2014/0000757 A1 | 1/2014 | Takahara et al. |
| 2014/0017040 A1 | 1/2014 | Takahara et al. |

OTHER PUBLICATIONS

Official Communication issued in European Patent Application No. 16834865.4, dated Apr. 2, 2019.
Official Communication issued in International Patent Application No. PCT/JP2016/067550, dated Jul. 12, 2016.

*Primary Examiner* — Nicole Blan
(74) *Attorney, Agent, or Firm* — Keating & Bennett, LLP

(57) ABSTRACT

A purge device is capable of removing particles adhering to a gas introduction port in a container or on surrounding areas of a purge nozzle. The purge device includes a nozzle that is able to blow a gas, and a purge controller that controls the nozzle to blow the gas therethrough in a state in which a bottom surface of a container to be purged faces the nozzle.

8 Claims, 6 Drawing Sheets

PURGE DEVICE, PURGE STOCKER, AND CLEANING METHOD

BACKGROUND OF THE INVENTION

1. Field of the Invention

The present invention relates to a purge device, a purge stocker, and a cleaning method.

2. Description of the Related Art

A purge stocker stores therein containers that are able to contain various kinds of articles such as wafers and reticles. Examples of the containers include FOUP, SMIF Pod, and reticle Pod. For storage of the containers, the purge stocker fills a purge gas such as clean dry air or nitrogen gas into the container by a purge device to suppress contamination and oxidation of contained matters. The purge device includes a purge port on which a container is placed and a purge nozzle connected to a gas introduction port in the container. The purge device supplies the purge gas to the inside of the container through the purge nozzle. When the container and the purge device are connected to each other, particles, resulting from contact between the gas introduction port and the purge nozzle, may adhere to the gas introduction port in the container, inside the purge nozzle, and on the surroundings of the purge nozzle. As a method for removing such particles, a method has been developed for causing the purge gas to flow through the purge nozzle before the container is carried to the purge port (see, for example, Japanese Patent No. 5557061).

The method in which the purge gas is caused to flow as in Japanese Patent No. 5557061 is able to remove particles inside the purge nozzle, but fails to remove particles adhering to the gas introduction port in the container or on an area surroundings a purge nozzle.

SUMMARY OF THE INVENTION

In view of the circumstances as described above, preferred embodiments of the present invention provide purge devices, purge stockers, and cleaning methods capable of removing particles adhering to a gas introduction port in a container or on an area surrounding a purge nozzle.

A purge device according to a preferred embodiment of the present invention includes: a nozzle that is able to blow a gas; and a purge controller that controls the nozzle to blow the gas therethrough in a state in which a bottom surface of a container to be purged and the nozzle face each other.

Furthermore, the nozzle may be a purge nozzle that is connected to a gas introduction port provided on the bottom surface of the container and that supplies a purge gas to inside of the container through the gas introduction port, and may blow the purge gas serving as the gas. The purge controller may start the blowing of the purge gas through the purge nozzle based on information on conveyance of the container to a purge position (e.g., information such as conveyance instructions). The purge controller may start the blowing of the purge gas through the purge nozzle after conveyance of the container is started and before the gas introduction port and the purge nozzle are connected to each other. The purge controller may start the blowing of the purge gas through the purge nozzle in accordance with an operation of a transfer device that lowers the container from above the purge nozzle. The purge controller may start the blowing of the purge gas through the purge nozzle in a state in which the gas introduction port and the purge nozzle face each other. The purge controller may continue the blowing of the purge gas through the purge nozzle even after the gas introduction port in the container and the purge nozzle are connected to each other so that the purge gas is supplied to the inside of the container. The purge controller may change a flow rate of the purge gas before and after the gas introduction port in the container and the nozzle are connected to each other.

A purge stocker according to a preferred embodiment of the present invention includes: the purge device; and a shelf that holds a container purged by the purge device.

A cleaning method according to a preferred embodiment of the present invention includes blowing a gas through a nozzle that is able to blow a gas in a state in which the nozzle and a bottom surface of a container to be purged face each other.

According to preferred embodiments of the present invention, gas is blown through a nozzle in the state in which a bottom surface of a container to be purged and the nozzle face each other. Thus, particles on the bottom surface of the container are able to be removed by the gas blown to the bottom surface of the container. Furthermore, particles on surrounding areas of the nozzle are able to be removed by the gas that returns to the nozzle side from the bottom surface side of the container.

Furthermore, a purge device according to a preferred embodiment of the present invention in which the nozzle is a purge nozzle that is connected to a gas introduction port provided on the bottom surface of the container and that supplies a purge gas to the inside of the container through the gas introduction port, and blows the purge gas serving as the gas is able to simplify the device configuration because the purge nozzle serves also as a nozzle that performs cleaning. Even when an atmosphere gas is mixed at a distal end of the purge nozzle, the gas is blown out before purging, and hence purging is able to be performed with a purge gas having high purity. The purge device in which the purge controller starts the blowing of the purge gas through the purge nozzle based on information on conveyance of the container to a purge position is able to allow accurate grasping of a positional relation between the container and the purge nozzle based on the conveyance information, and is thus able to remove particles efficiently and reliably. The purge device in which the purge controller starts the blowing of the purge gas through the purge nozzle after conveyance of the container is started and before the gas introduction port and the purge nozzle are connected to each other is able to reduce waste of the purge gas as compared with a purge device that starts the blowing of the purge gas before the conveyance of the container is started. The purge device in which the purge controller starts the blowing of the purge gas through the purge nozzle in the state in which the bottom surface of the container and the purge nozzle face each other is able to reduce waste of the purge gas as compared with a purge device that blows the purge gas before the bottom surface of the container and the purge nozzle face each other. The purge device in which the purge controller starts the blowing of the purge gas through the purge nozzle in accordance with an operation of a transfer device that lowers the container from above the purge nozzle is able to remove particles efficiently and reliably because a gap between the container and the purge nozzle is reduced. The purge device in which the purge controller continues the blowing of the purge gas through the purge nozzle even after the gas introduction port in the container and the nozzle are connected to each other so that the purge gas is supplied to the inside of the container is able to quickly shift from the state of cleaning to the state of purging. The purge device in which the purge controller changes a flow rate of the purge gas before and after the gas introduction port in the container and the purge nozzle are connected to each other is able to use, for example, a flow rate suited for cleaning and a flow rate suited for purging as appropriate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments are described below with reference to the drawings. In each of the figures referred to below, an XYZ coordinate system is used to describe the directions in the figure. In the XYZ coordinate system, the vertical direction is a Z direction, and the horizontal directions are an X direction and a Y direction.

Figure 1A:
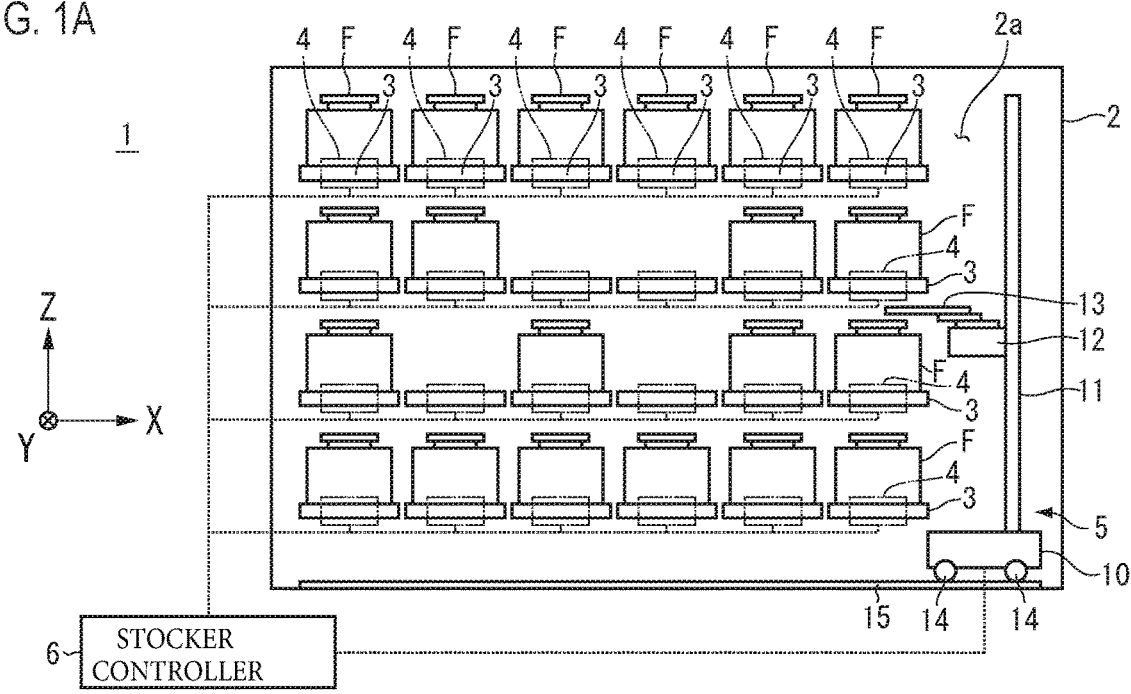
FIGS. 1A and 1B include diagrams illustrating a purge stocker according to a preferred embodiment of the present invention.
Figure 1B:
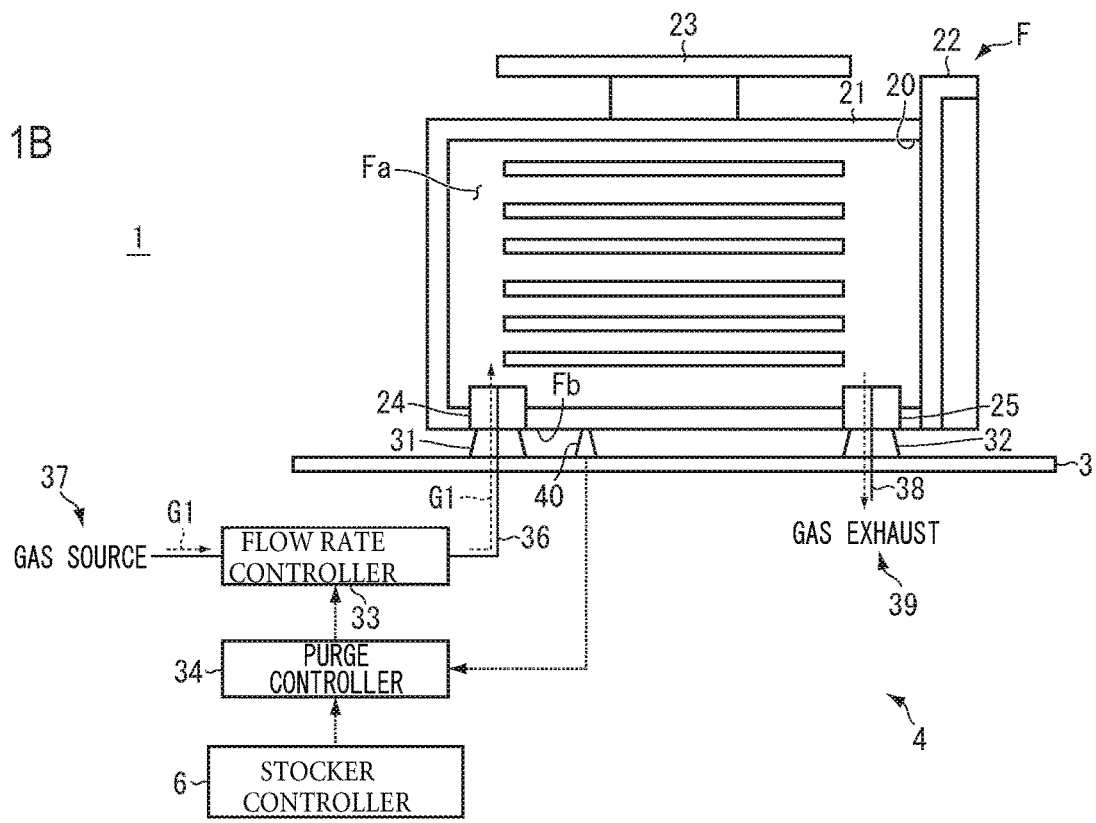

FIG. 1A is a diagram illustrating an example of a purge stocker 1 according to the present preferred embodiment. FIG. 1B is a diagram illustrating an example of a container F and a purge device 4. The purge stocker 1 is, for example, an automatic warehouse that stores therein containers F that are structured to contain articles such as wafers and reticles used to manufacture semiconductor elements. Examples of the containers F include FOUP, SMIF Pod, and reticle Pod. Reticles may be used for a liquid immersion exposure device or may be used for EUV.

As illustrated in FIG. 1A, the purge stocker 1 includes a casing 2, a plurality of storage shelves 3, a plurality of purge devices 4, a stacker crane (conveyor) 5, and a stocker controller 6. The casing 2 includes an internal space 2a that is isolatable from the outside. The casing 2 includes a loading and unloading port (not shown) through which a container F is transferred between the outside of the casing 2 and the internal space 2a. The storage shelves 3, the purge devices 4, and the stacker crane 5 are arranged in the internal space 2a in the casing 2. The stocker controller 6 may be disposed inside or outside the casing 2. The stocker controller 6 controls the purge devices 4 and the stacker crane 5. Note that a controller that controls the purge device 4 and a controller that controls the stacker crane 5 may be separately provided.

The stacker crane 5 is able to convey the container F in each of the X direction, the Y direction, and the Z direction, and is, for example, able to convey the container F between a loading and unloading port and the storage shelf 3 and convey the container F from a storage shelf 3 to another storage shelf 3. The stacker crane 5 includes, for example, a traveling carriage 10, a support column 11, a support base 12, and a transfer device 13. The traveling carriage 10 includes a plurality of wheels 14, and moves in the horizontal direction (X direction) along a rail 15 provided on the bottom surface of the casing 2.

The support column 11 extends from the top surface of the traveling carriage 10 in the vertical direction (Z direction). The support base 12 is supported by the support column 11, and is slidable in the Z direction along the support column 11. The transfer device 13 includes, for example, an extendable arm and a mount including a top surface on which a container F is able to be placed. Note that, for example, in place of the stacker crane 5 that has the container F placed thereon, the stacker crane 5 may grip a flange 23 (see FIG. 1B) on top of the container F and convey the container F while suspending the container F or may convey the container F while gripping a side surface of the container F. Furthermore, although FIGS. 1A and 1B illustrate one stacker crane 5, the number of the stacker cranes 5 provided in the casing 2 may be two or more.

The storage shelves 3 are arranged in a plurality of stages in the height direction (Z direction) and arranged in a plurality of rows in the horizontal direction (X direction). The storage shelves 3 are each able to have a container F placed thereon. The storage shelves 3 are each a shelf that is able to hold a container F purged by the purge device 4. Note that some storage shelves 3 may have no containers F placed thereon depending on the storage conditions of containers F.

FIG. 1B illustrates FOUP as an example of the container F. The container F includes a box-shaped main body 21 including an opening 20 in the front surface and a lid 22 that closes the opening 20. An article such as a wafer is contained in an interior Fa (internal space, containing space) of the container F through the opening 20. The flange 23 is provided on top of the main body 21. The main body 21 includes, on its bottom surface Fb side, recesses (not shown) for positioning. Examples of the recesses include grooves that radially extend from the center of the bottom surface Fb of the main body 21. Pins (not shown) for positioning provided to a mounting table of the transfer device 13 are to be fitted into the recesses such that the container F is positioned with respect to the mounting table of the transfer device 13 when the container F is conveyed.

The storage shelf 3 includes a cutout (not shown) that allows the mounting table of the transfer device 13 to pass therethrough in the vertical direction. The transfer device 13 causes the mounting table to move inward from above the storage shelf 3 through the cutout to transfer a container F onto the top surface of the storage shelf 3. Pins (not shown) for positioning are provided on the top surface of the storage shelf 3. The pins on the top surface of the storage shelf 3 are to be fitted into the recesses on the bottom surface Fb side of the container F such that the container F is positioned with respect to the storage shelf 3 when the container F is placed on the storage shelf 3. The main body 21 of the container F includes a gas introduction port 24 and a gas exhaust port 25 on the bottom surface Fb side.

For example, a gas introduction port (denoted by reference symbol 41 in FIGS. 2A and 2B referred to later), a filter, and a check valve are provided in the gas introduction port 24. The gas introduction port communicates with the interior Fa in the main body 21 and the outside. The inside of the gas introduction port is a flow path for a purge gas G1 supplied to the interior Fa in the container F, and the filter is provided in the flow path. The filter is, for example, a particle filter, and removes dust contained in a gas passing through the gas introduction port. The check valve in the gas introduction port 24 prevents a gas from flowing out to the outside from the interior Fa in the container F through the gas introduction port. For example, an exhaust port, a check valve, and a filter are provided in the gas exhaust port 25. The exhaust port communicates with the interior Fa in the main body 21 and the outside. The check valve in the gas exhaust port 25 prevents a gas from flowing into the interior Fa from the outside of the container F through the exhaust port. The filter is, for example, a particle filter, and removes dust contained in a gas passing through the exhaust port. In the gas passing through the exhaust port, the ratio of an atmosphere gas in the interior Fa in the container F before purging is high at the timing immediately after the start of purging, and the ratio of the purge gas G1 becomes higher as time elapses from the start of purging. The purge device 4 includes a purge nozzle 31, an exhaust nozzle 32, a flow rate controller 33, and a purge controller 34. The purge nozzle 31 and the exhaust nozzle 32 are provided on the top surface of the storage shelf 3. The purge nozzle 31 and the exhaust nozzle 32 are arranged so as to be connected to the gas introduction port and the exhaust port, respectively, when the container F is placed on the storage shelf 3. When the container F is placed on the storage shelf 3, the gas introduction port in the container F is connected to a pipe 36 through the purge nozzle 31, and is further connected to a gas source 37 through the flow rate controller 33. The exhaust nozzle 32 is connected to an exhaust path (gas exhaust 39) for the purge gas G1 through a pipe 38.

The gas source 37 supplies a purge gas G1. The type of the purge gas G1 is selected depending on matters contained in the container F. For example, a gas that suppresses oxidation and molecular contamination of contained matters or a gas that reduces moisture inside the container F is preferably used. For example, when the contained matter is a silicon wafer, an inactive gas such as nitrogen gas is used as the purge gas G1. When the nitrogen gas is supplied to the interior Fa in the container F, an atmosphere gas containing oxygen is discharged (removed) to the outside from inside the container F, and the silicon wafer is prevented from being oxidized. Furthermore, when the contained matter is a reticle, a dry gas such as clean dry air (CDA) is preferably used as the purge gas G1, for example. When the clean dry air is supplied to the interior Fa in the container F, an atmosphere gas containing moisture is discharged (removed) to the outside from inside the container F, and moisture is prevented from adhering to the reticle. The gas source 37 may be a part of the purge stocker 1, or may be a device outside the purge stocker 1. For example, the gas source 37 may be a facility in a factory where the purge stocker 1 is provided.

To purge the container F, the purge gas G1 from the gas source 37 is supplied via the flow rate controller 33 and the pipe 36 to the interior Fa through the gas introduction port in the container F, and is filled in the interior Fa in the container F. Furthermore, the gas in the interior Fa is discharged to the outside of the container F through the exhaust port, and is discharged to the outside by the gas exhaust 39 through the pipe 38. Note that the gas exhaust 39 may be provided with a device that sucks a gas by using a pump. The container F is not necessarily required to have the gas exhaust port 25, and in this case, the purge device 4 is not necessarily required to have the exhaust nozzle 32. For example, when the pressure in the interior Fa in the container F becomes equal to or larger than a threshold, a gas in the interior Fa in the container F leaks to the outside through a gap between the opening 20 and the lid 22, and hence even when the gas exhaust port 25 is not provided, the gas in the interior Fa in the container F is able to be discharged to the outside.

The flow rate controller 33 controls the flow rate of the purge gas G1 in the pipe 36 connected to the container F (flow path between the gas introduction port in the container F and the gas source 37). A non-limiting example of the flow rate controller 33 is a mass flow controller. The flow rate controller 33 has a flow path therein through which the purge gas G1 flows. For example, a flowmeter using a self-heat generating resistor and a flow rate control valve such as an electromagnetic valve may be provided in the flow path inside the flow rate controller 33. The flow rate controller 33 performs feedback control of the electromagnetic valve based on the measurement result of the flowmeter, and controls the flow rate of the purge gas G1 inside the flow rate controller 33 to approach a target value. By controlling the flow rate of the purge gas G1 in the pipe 36 by the flow rate controller 33, the flow rate of the purge gas G1 supplied from the gas source 37 to the purge nozzle 31 is controlled. The flow rate controller 33 is communicably connected to the purge controller 34, and controls the flow rate of the purge gas G1 based on a control signal supplied from the purge controller 34.

The stocker controller 6 controls the purge device 4 by supplying a control instruction to the purge controller 34. The stocker controller 6 controls the stacker crane 5 to convey a container F to be purged to the purge device 4, and controls the purge device 4 to purge the container F. In the storage shelf 3, a presence/absence sensor 40 (stock sensor) capable of detecting whether a container F is placed is provided. The presence/absence sensor 40 is a contact sensor such as a button sensor, and when pressed down by the bottom surface of the container F, detects that the container F has been placed on the storage shelf 3. The presence/absence sensor 40 is communicably connected to the purge controller 34, and supplies the detection result to the purge controller 34.

An inputter and a display are connected to the stocker controller 6. Examples of the inputter include an operation panel, a touch panel, a keyboard, a mouse, and a trackball. The inputter detects an input from an operator, and supplies input information to the stocker controller. Furthermore, examples of the above-mentioned display include a liquid crystal display. The display displays images supplied from the stocker controller 6. For example, the stocker controller 6 displays images indicating the operating status, various kinds of settings, and the purging state in the purge stocker 1 on the display.

Figure 2A:
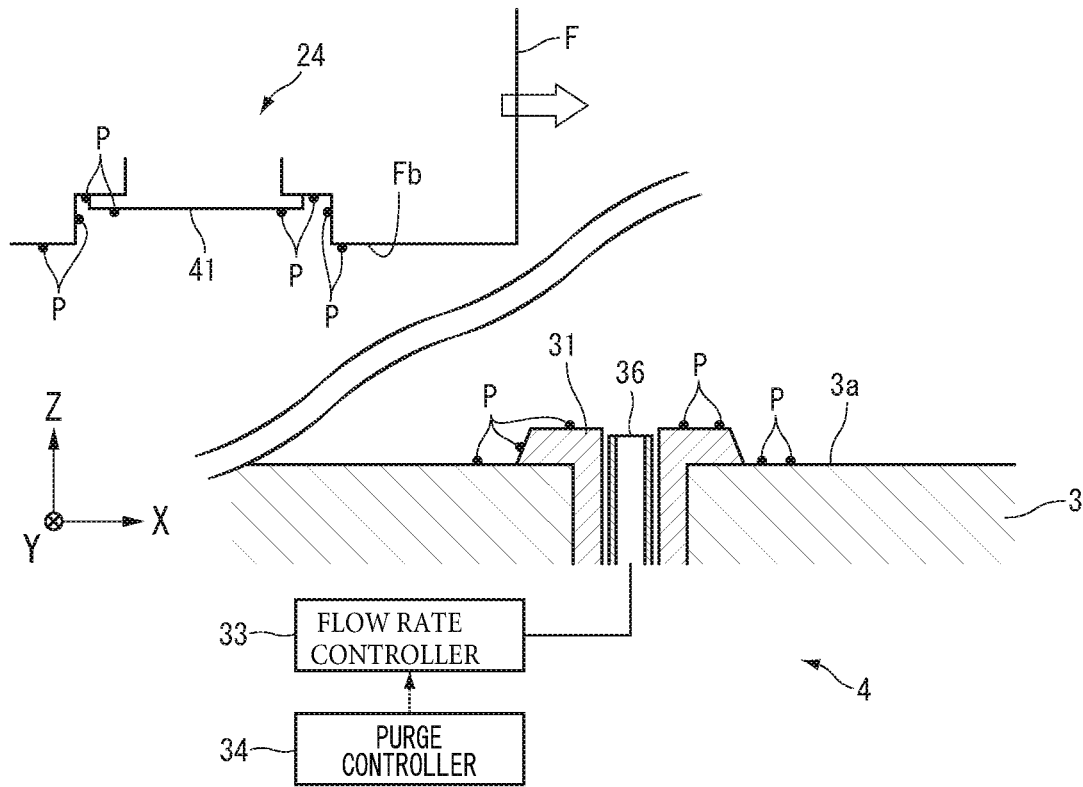
FIGS. 2A and 2B include explanatory diagrams illustrating an operation of a purge device according to a preferred embodiment of the present invention.
Figure 2B:
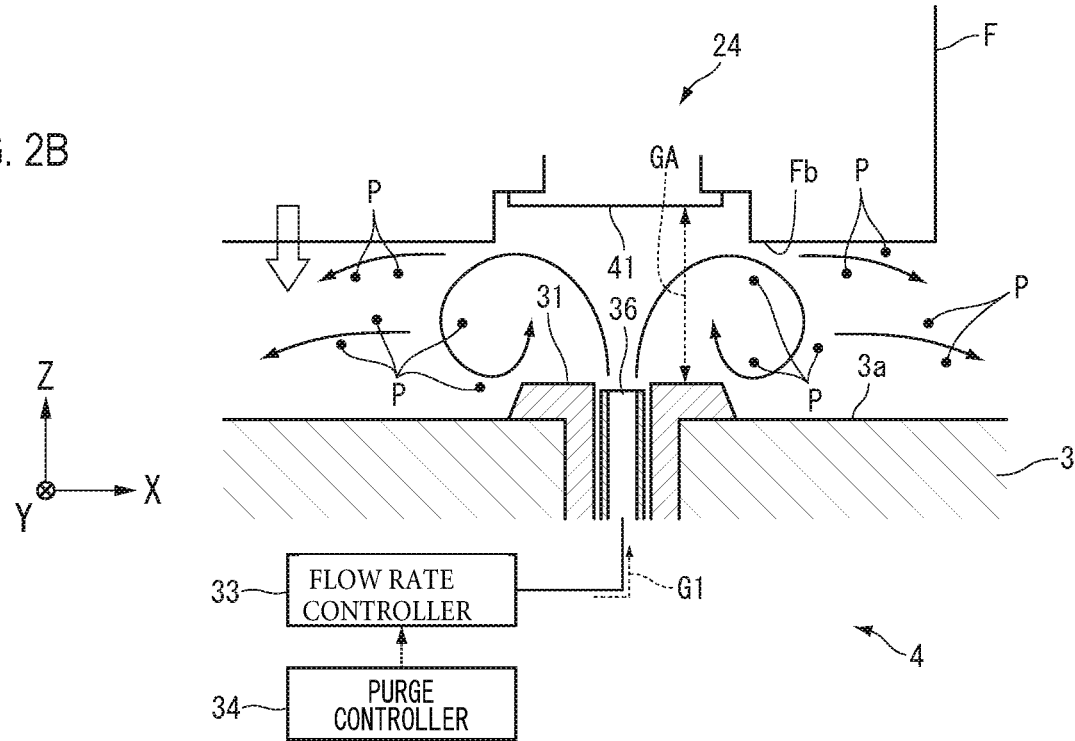

FIGS. 2A and 2B include explanatory diagrams illustrating the operation of the purge device according to the present preferred embodiment. FIG. 2A illustrates the state of process in which the container F is conveyed to the purge device (purge position). FIG. 2B illustrates the state of process in which the container F is connected to the purge device 4. As illustrated in FIG. 2A, on the bottom surface Fb of the container F, particles P may adhere to the gas introduction port 41 or its surroundings. Note that a lower end surface of the gas introduction port 41 is a portion of the bottom surface Fb. Furthermore, particles P may adhere to the purge nozzle 31 or its surroundings. For example, the particles P result from contact between the purge nozzle 31 and the gas introduction port in the container F when the purge nozzle 31 and the gas introduction port in the container F are connected to each other, or the particles P adhere when the container F contacts with a member other than the purge nozzle 31 (for example, a shelf in a conveyance path or a shelf in a processing device). Such particles P may enter the interior Fa in the container F and contaminate contained matters. In view of the above, the purge device 4 according to the present preferred embodiment performs cleaning (cleaning treatment) to remove particles P adhering to the gas introduction port in the container F or to the surroundings of the purge nozzle 31.

In the present example, in the purging (purging treatment) for the container F, the purge nozzle 31 that supplies the purge gas G1 (see FIG. 1B) to the inside of the container F is used as a nozzle to perform cleaning. As illustrated in FIG. 2B, the purge controller 34 performs a control process to blow the purge gas G1 through the purge nozzle 31 in the state in which the bottom surface Fb of the container F to be purged faces the purge nozzle 31. In FIG. 2B, the container F is carried to a position immediately above a purge position by the transfer device 13 (see FIG. 1A). In this state, the container F is lowered by the transfer device 13 to be disposed at the position at which the gas introduction port 41 is connected to the purge nozzle 31, and hence the gas introduction port 41 and the purge nozzle 31 have a positional relation in which the gas introduction port 41 and the purge nozzle 31 face each other.

For example, the purge controller 34 controls the flow rate controller 33 to blow the purge gas G1 through the purge nozzle 31 in the period during which the transfer device 13 lowers the container F from above the purge nozzle 31. When blown from the pipe 36, the purge gas G1 blows off the particles P adhering to the inner wall of the pipe 36 or to the inner wall of the purge nozzle 31 such that the particles P float in the atmosphere (the space between the purge nozzle 31 and the bottom surface Fb of the container F). Furthermore, the blown purge gas G1 reaches the bottom surface Fb of the container F (gas introduction port 41 and its surroundings), and blows off the particles P adhering to the surface thereof such that the particles P float in the atmosphere. The blown purge gas G1 is blocked by the bottom surface Fb of the container F to form an eddy, thus forming a flow returning from the container F side to the purge nozzle 31 side. The flow of the purge gas G1 blows off the particles P adhering to the surroundings of the purge nozzle 31 such that the particles P float in the atmosphere. The purge gas G1 flows laterally through a space between the bottom surface Fb of the container F and the top surface of the purge nozzle 31 and between the bottom surface Fb of the container F and an installation surface 3a of the purge nozzle 31 (top surface of the storage shelf 3), and laterally carries the particles P floating in the atmosphere.

Reference symbol GA denotes a gap between the bottom surface Fb of the container F and the top surface of the purge nozzle 31. The purge controller 34 controls the flow rate controller 33 to obtain the gap GA such that the purge gas G1 is blown through the purge nozzle 31 in a state in which the purge gas G1 through the purge nozzle 31 reaches the bottom surface Fb of the container F. Furthermore, the purge controller 34 controls the flow rate controller 33 to obtain the gap GA such that the purge gas G1 is blown through the purge nozzle 31 in a state in which the purge gas G1 that has reached the bottom surface Fb through the purge nozzle 31 and has been turned back by the bottom surface Fb reaches the surroundings of the purge nozzle 31. Such a gap GA is defined in accordance with the flow speed of the purge gas G1. For example, the gap GA may be about 50 mm or less, about 20 mm or less, or about 10 mm or less.

As described above, the particles P are carried to the outside of the storage shelf 3 in the horizontal direction, and are removed from the space between the bottom surface Fb of the container F and the purge nozzle 31. The purge stocker 1 illustrated in FIG. 1A includes a circulation system (not shown) that circulates an atmosphere gas in the internal space 2a in the casing 2, and the circulation system forms the flow of air flowing through the internal space 2a from the ceiling side to the floor side. The particles P carried to the outside of the storage shelf 3 are carried to the floor side by the flow of air, and captured by a filter in the above-mentioned circulation system to be removed from the internal space 2a in the casing 2.

Figure 3:
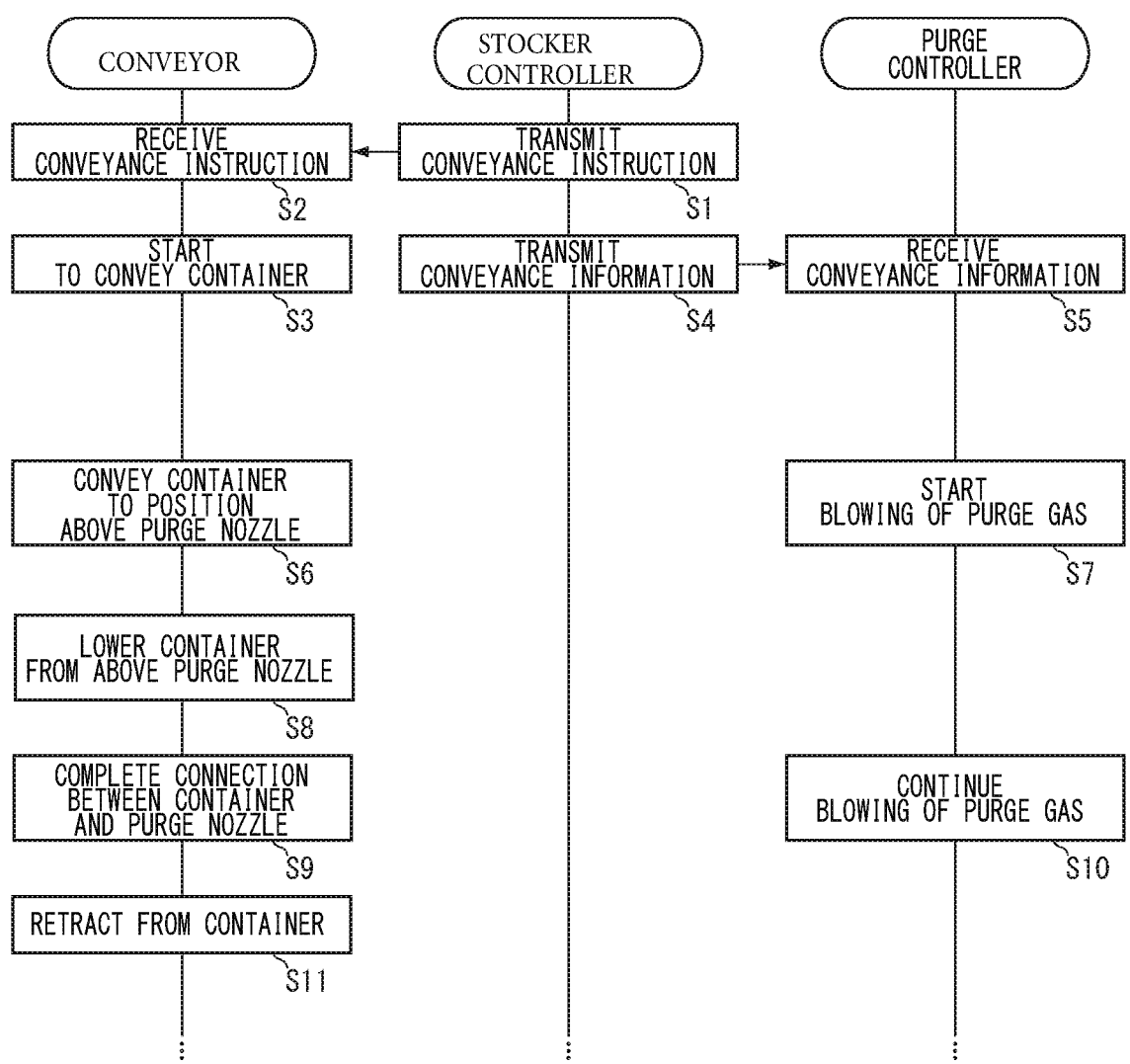
FIG. 3 is a sequence diagram illustrating an example of an operation of the purge stocker according to a preferred embodiment of the present invention.

Next, a cleaning method and a purge method according to additional preferred embodiments of the present invention are described based on the operation of the above-mentioned purge stocker 1. FIG. 3 is a sequence diagram illustrating an example of the operation of the purge stocker 1 according to the present preferred embodiment. In the purge stocker 1, a container F to be purged (to be stored) is carried to the loading and unloading port from a ceiling conveyor. At Step S1, the stocker controller 6 designates a purge device 4 (storage shelf 3) to which the container F is to be conveyed, and transmits an instruction (conveyance instruction) to convey the container F to the stacker crane 5 (denoted by "conveyor" in FIG. 3 and other figures). The conveyor receives the conveyance instruction at Step S2, and starts to convey the container F in accordance with the conveyance instruction at Step S3.

Furthermore, the stocker controller 6 transmits conveyance information indicating that a container F to be purged is carried in to the purge controller 34 of the purge device 4 to which the container F is to be conveyed. At Step S5, the purge controller 34 receives the conveyance information. At Step S6, the conveyor conveys the container F to the position above the purge nozzle 31. At Step S7, the purge controller 34 starts the blowing of the purge gas G1 through the purge nozzle 31 based on the conveyance information from the stocker controller 6, thus starting cleaning. For example, the purge controller 34 starts the blowing of the purge gas G1 through the purge nozzle 31 in response to the reception of the conveyance information or being triggered by the reception of the conveyance information. In this manner, the cleaning method according to the present preferred embodiment includes the step for blowing a gas through a nozzle (for example, purge nozzle 31) that is able to blow a gas (for example, purge gas G1) in the state in which the nozzle and the bottom surface Fb of a container F to be purged face each other.

At Step S8, the conveyor lowers the mounting table of the transfer device 13 on which the container F is placed, thus lowering the container F from above the purge nozzle 31. The container F is lowered in the state in which the gas introduction port 41 and the purge nozzle 31 are substantially positioned so as to face each other, and the pins for positioning are inserted in the recesses of the bottom surface Fb, so that the container F is accurately positioned with respect to the purge device 4 (purge nozzle 31). At Step S9, the conveyor places the container F on the storage shelf 3, and completes the connection between the container F and the purge device 4, that is, the connection between the gas introduction port 41 (see FIG. 2B) in the container F and the purge nozzle 31. The purge controller 34 continues the blowing of the purge gas G1 in the period during which the conveyor performs the processing of Steps S6, S8, and S9, and the particles P are removed as described above with reference to FIG. 2B. When the connection between the container F and the purge nozzle is completed at Step S9, the purge gas G1 is supplied through the purge nozzle 31 to the interior Fa in the container F, and the cleaning is finished.

The purge controller 34 continues the blowing of the purge gas G1 through the purge nozzle 31 (Step S10) even after the gas introduction port 41 in the container F and the nozzle are connected to each other (after Step S9), and supplies the purge gas G1 to the inside of the container F. In other words, the purge controller 34 purges the container F at Step S10 and subsequent steps following the cleaning at Step S7 and subsequent steps. In this manner, the purge method according to the present preferred embodiment includes purging the container F subjected to the above-mentioned cleaning. The cleaning is performed as pretreatment of purging (pre-purging). Note that, at Step S11, the conveyor is retracted from the container F to carry the next container F.

Figure 4A:
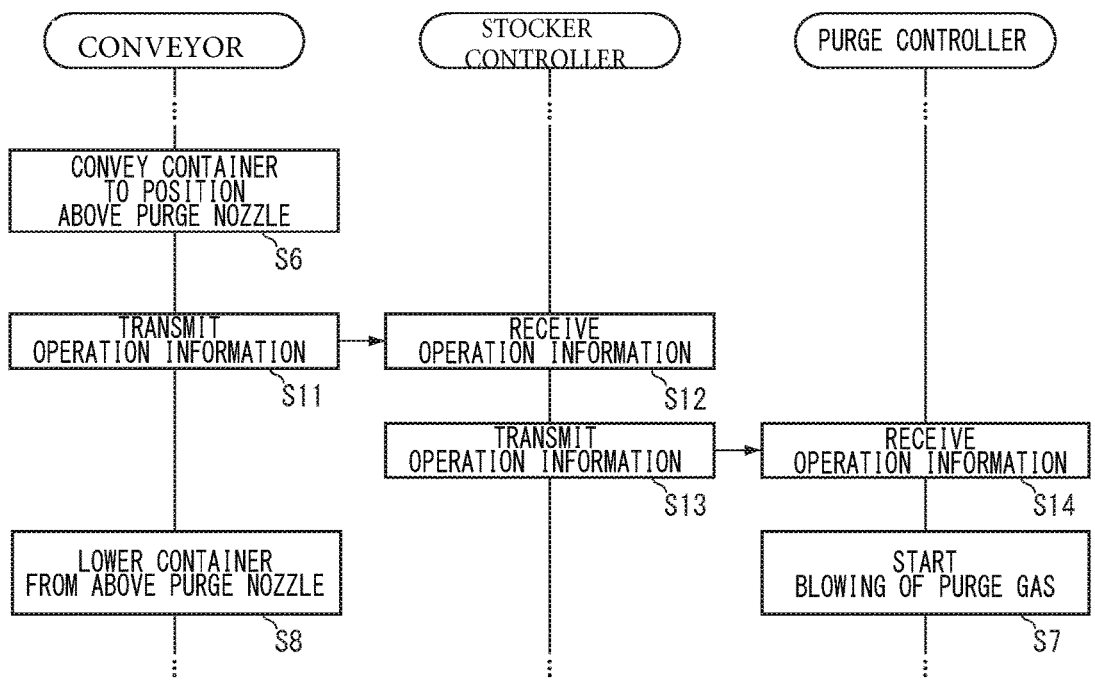
FIGS. 4A and 4B include sequence diagrams illustrating other examples of the operation of the purge stocker according to a preferred embodiment of the present invention.
Figure 4B:
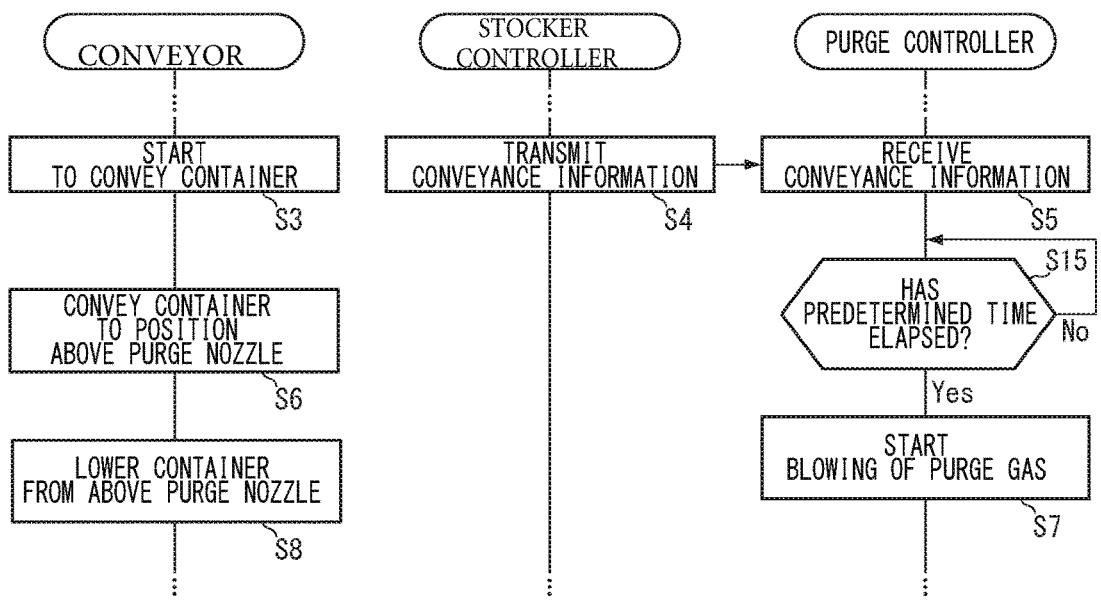

FIGS. 4A and 4B include sequence diagrams illustrating other examples of the operation of the purge stocker 1. In the example in FIG. 4A, the purge controller 34 starts the blowing of the purge gas G1 through the purge nozzle in accordance with an operation of the transfer device 13 to lower the container F from above the purge nozzle 31. The conveyor conveys the container F to the position above the purge nozzle at Step S6, and thereafter transmits operation information to the stocker controller 6 at Step S11. The operation information is information indicating at which stage the process of the conveyance is. The conveyor transmits, as the operation information, an information that the container will be lowered next by way of lowering of the transfer device 13. The stocker controller 6 receives the operation information at Step S12, and transmits the operation information to the purge controller 34 at Step S13. The purge controller 34 receives the operation information at Step S14, and starts the blowing of the purge gas G1 at Step S7 based on the operation information. For example, the purge controller 34 starts the blowing of the purge gas G1 in response to the reception of the operation information (triggered by the reception of the operation information). After transmitting the operation information, at Step S8, the conveyor lowers the container F from above the purge nozzle 31, and the purge controller 34 performs control to blow the purge gas G1 in parallel to the lowering of the container F.

Note that, at Step S13, the stocker controller 6 may transmit an instruction to start the blowing of the purge gas G1 to the purge controller 34 instead of the operation information. Furthermore, the timing at which the conveyor transmits the operation information is not limited to the timing after Step S6, and the conveyor may transmit the operation information regularly or each time the operation is switched. The stocker controller 6 may determine (grasp) at which stage in the process of conveyance the current state is based on the operation information and may transmit an instruction to start the blowing of the purge gas G1 to the purge controller 34 based on the determination result. The conveyor may directly transmit the conveyance information to the purge controller 34, or may transmit an instruction to start the blowing of the purge gas G1 to the purge controller 34 in accordance with the stage in the process of conveyance.

In the example in FIG. 4B, the purge controller 34 adjusts the timing for blowing the purge gas G1. After receiving the conveyance information at Step S5, the purge controller 34 determines at Step S15 whether a predetermined time set in advance has elapsed. The predetermined time is set based on a time from when the conveyor starts to convey the container F to when the process of the conveyance reaches a predetermined stage. For example, the above-mentioned predetermined time is set to a time from the start of the conveyance until the container F is conveyed to the position above the purge nozzle 31. When the purge controller 34 determines that the predetermined time has not elapsed (No at Step S15), the purge controller 34 repeatedly performs the processing of Step S15. When the purge controller 34 determines that the predetermined time has elapsed (Yes at Step S15), the purge controller 34 starts the blowing of the purge gas G1 at Step S7. In this manner, the purge controller 34 generates a delay by the processing of Step S15, thus starting the blowing of the purge gas G1 in synchronization with the conveyor. For example, the purge controller 34 starts the blowing of the purge gas G1 in synchronization with an operation of the conveyor lowering the container F from above the purge nozzle 31.

Figure 5:
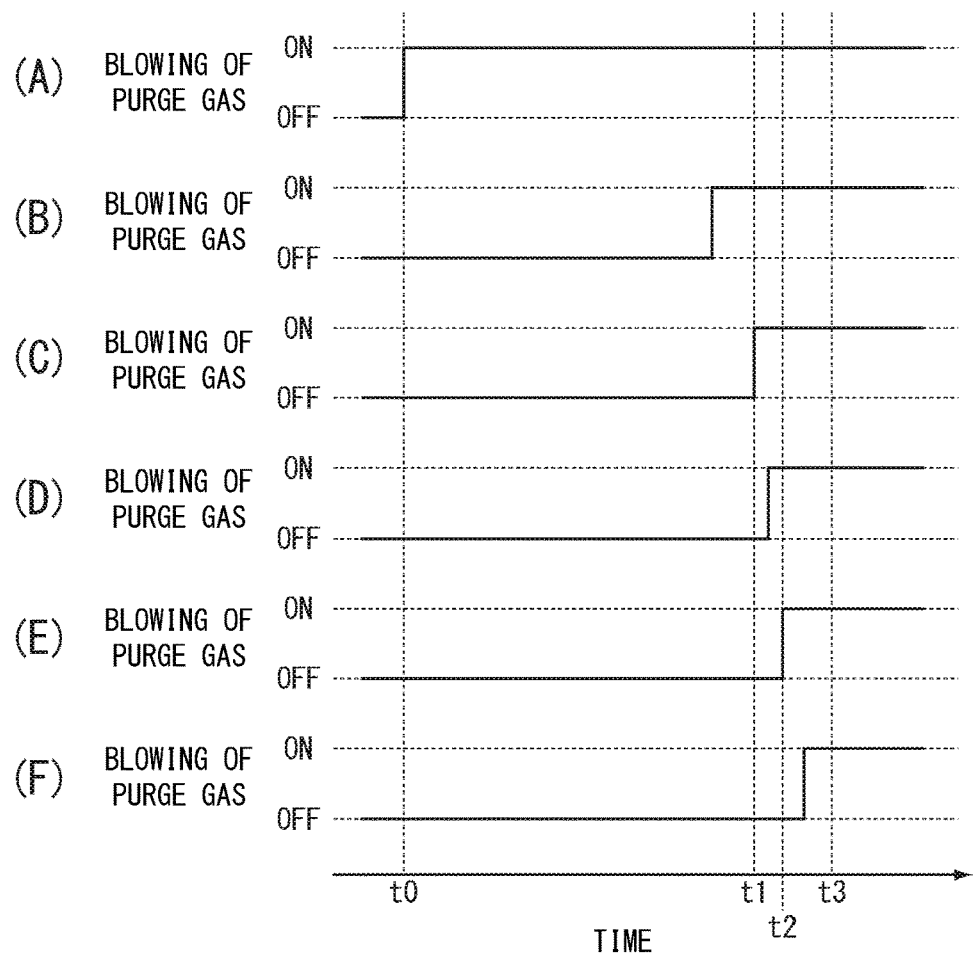
FIG. 5 is a diagram illustrating an example of timing for starting the blowing of a purge gas.

FIG. 5 is a diagram illustrating an example of timing for starting the blowing of the purge gas G1. In FIG. 5, symbol t0 represents the time at which the container F starts to be conveyed, symbol t1 represents the time at which the container F reaches the position above the purge nozzle 31, symbol t2 represents the time at which the conveyor starts to lower the container F from above the purge nozzle 31, and symbol t3 represents the time at which the connection between the purge nozzle 31 and the gas introduction port 41 in the container F is completed. In FIG. 5, the state in which the purge gas G1 is set not to be blown is represented by OFF, and the state in which the purge gas G1 is set to be blown is represented by ON. Furthermore, in FIG. 5, the setting of the blowing of the purge gas G1 is conceptually illustrated, with a delay of communication and the responsiveness of the flow rate controller 33 being ignored.

In part (A) in FIG. 5, the blowing of the purge gas G1 is switched from OFF to ON at substantially the same time as the time t0 at which the conveyance of the container F is started, and the blowing of the purge gas G1 is maintained ON also after the time t3 at which the connection between the purge nozzle 31 and the gas introduction port 41 is completed. In part (B) in FIG. 5, the blowing of the purge gas G1 is switched from OFF to ON at a time between the time t0 at which the conveyance of the container F is started and the time t1 at which the container F reaches the position above the purge nozzle 31. For example, the time at which the blowing of the purge gas G1 is switched from OFF to ON is set to a time slightly before the time t1 by providing a margin to the time t1 such that the purge gas G1 is being blown at the time t1. In part (C) in FIG. 5, the blowing of the purge gas G1 is switched from OFF to ON at substantially the same time as the time t1. In part (D) in FIG. 5, the blowing of the purge gas G1 is switched from OFF to ON at a time between the time t1 and the time t2 at which the conveyor starts to lower the container F from above the purge nozzle 31. In part (E) in FIG. 5, the blowing of the purge gas G1 is switched from OFF to ON at substantially the same time as the time t2. In part (F) in FIG. 5, the blowing of the purge gas G1 is switched from OFF to ON at a time between the time t2 and the time t3 at which the connection between the purge nozzle 31 and the gas introduction port 41 is completed.

As illustrated in FIG. 5, the timing for starting the blowing of the purge gas G1 may be set to any time in the period before the connection between the purge nozzle 31 and the gas introduction port 41 in the container F is completed. Note that the consumption amount of purge gas required for cleaning is reduced further as the timing for starting the blowing of the purge gas G1 is delayed longer. Furthermore, as the gap GA between the bottom surface Fb of the container F and the purge nozzle 31 becomes narrower, the flow of air on the bottom surface Fb or around the purge nozzle 31 becomes stronger, which enables the particles P to be removed more efficiently. In other words, by delaying the timing for starting the blowing of the purge gas G1, the cleaning is selectively performed in a state in which the gap GA is narrow, and hence the particles P are removed efficiently while taking the consumption amount of the purge gas G1 into consideration.

Figure 6:
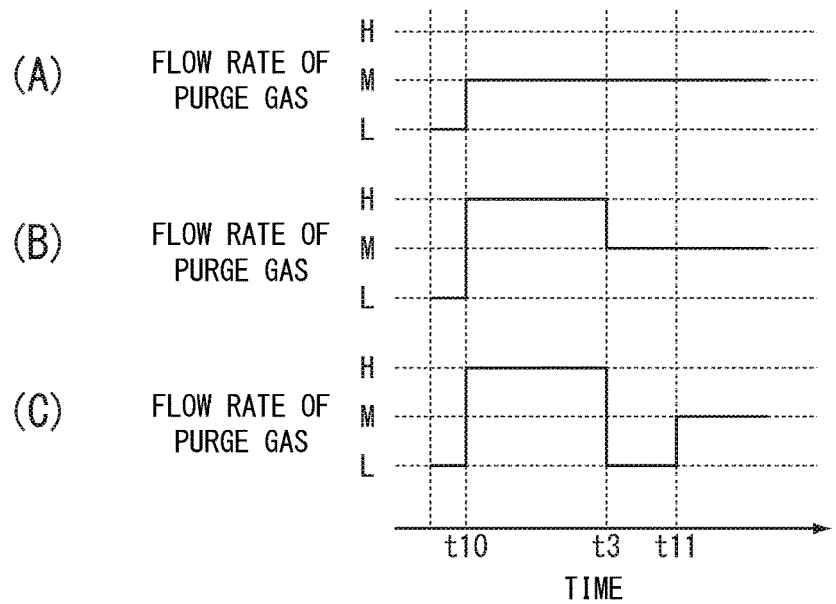
FIG. 6 is a diagram illustrating an example of the flow rate of the purge gas.

FIG. 6 is a diagram illustrating an example of the flow rate of the purge gas G1. In FIG. 6, "L" indicates a flow rate (for example, 0) measured when the flow rate of the purge gas G1 is narrowed to the minimum, "M" indicates a flow rate for purging, and "H" indicates a flow rate larger than "M" (for example, the maximum flow rate permissible for the flow rate controller 33). FIG. 6 conceptually illustrates the flow rate, provided that the flow rate changes stepwise. The purge controller 34 changes the flow rate of the purge gas G1 by controlling the flow rate controller 33. In FIG. 6, t10 is the time at which the blowing of the purge gas G1 is set to ON, and time t3 is the time at which the connection between the purge nozzle 31 and the gas introduction port 41 is completed similarly to FIG. 5.

In part (A) in FIG. 6, the flow rate changes from L to M at the time t10, and the flow rate is maintained to M also after the time t3. The use of such a supply pattern (temporal history of flow rate) of the purge gas G1 enables the control of the flow rate to be simplified. In part (B) in FIG. 6, the flow rate changes from L to H at the time t10, the flow rate changes from H to M at the time t3, and the flow rate is maintained to M after the time t3. The period from the time t10 to the time t3 corresponds to a period for performing cleaning with the purge gas G1. By increasing the flow rate in this period to be larger than the flow rate for purging ("M"), the particles P can be removed more effectively. In part (C) in FIG. 6, the pattern until the time t3 is the same as in part (B) in FIG. 6, but the flow rate changes from H to L at the time t3, and the flow rate changes from L to M at the time t11. In other words, in part (C) in FIG. 6, the blowing of the purge gas G1 is temporarily stopped at the timing at which the connection between the purge nozzle 31 and the gas introduction port 41 is completed or immediately before this timing, and the purging is performed from the time t11. In this manner, a suspended period (for example, the period from the time t3 to the time t11) may be provided between the period for cleaning and the period for purging. Furthermore, as illustrated in part (B) in FIG. 6 where the flow rate becomes M immediately before the time t3, the flow rate may change at the time point before t3 continuously or stepwise. The flow rate may change in the period for cleaning. For example, the purge gas G1 may be blown intermittently.

Figure 7A:
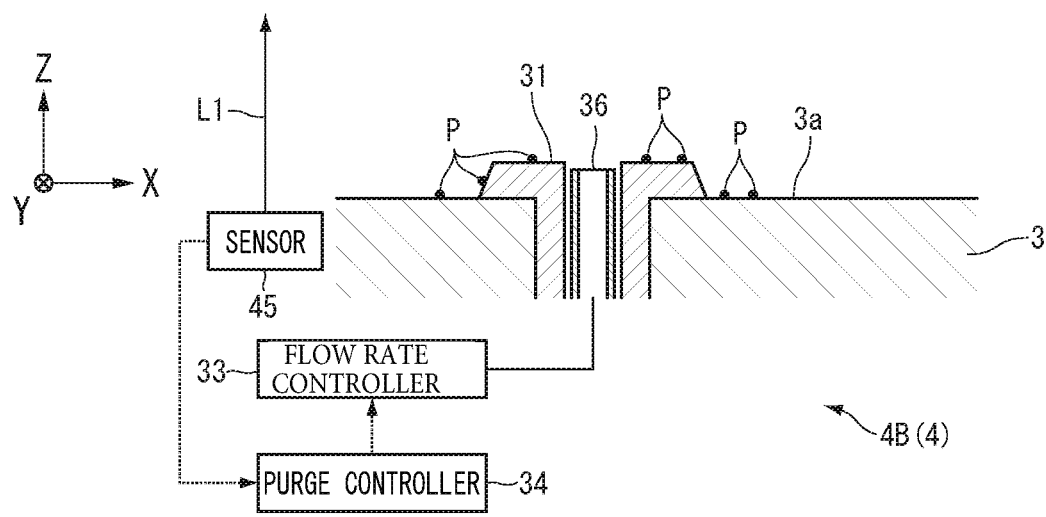
FIGS. 7A and 7B include diagrams illustrating a purge device according to a modification of a preferred embodiment of the present invention.
Figure 7B:
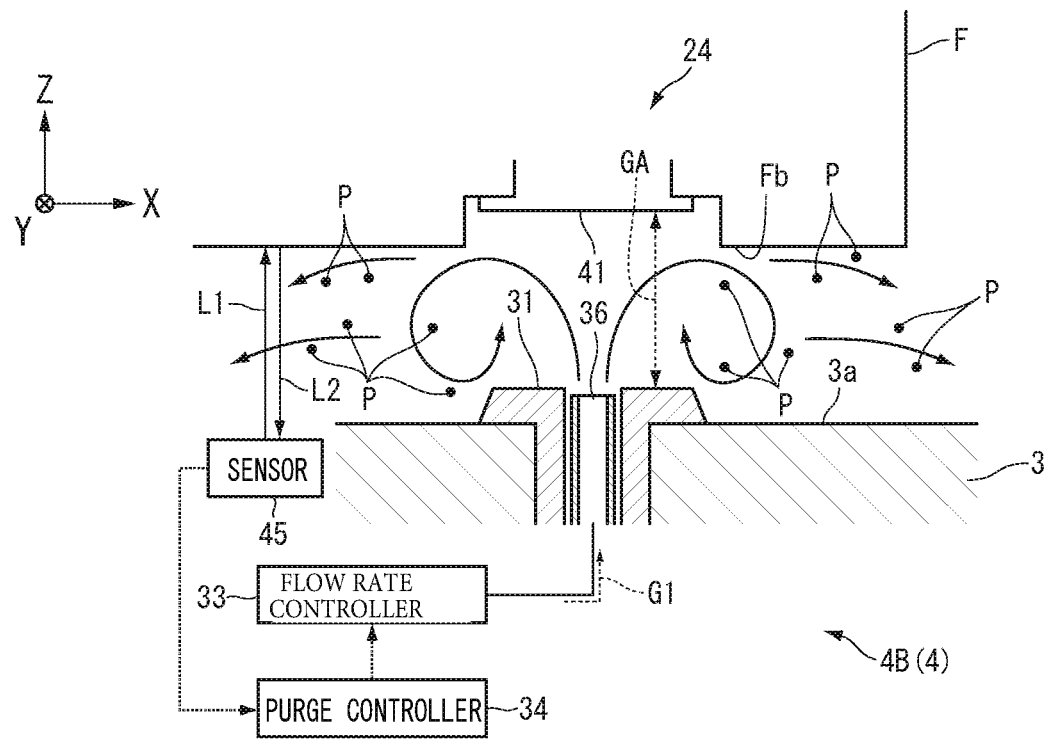

Next, a modification of a preferred embodiment of the present invention is described. FIGS. 7A and 7B include diagrams illustrating a purge device 4B according to the modification. The purge device 4B includes a sensor 45 capable of detecting that a container F has been placed above the sensor 45. A non-limiting example of the sensor 45 is an optical sensor. The sensor 45 radiates detection light L1 upward as illustrated in FIG. 7A, and detects return light L2 reflected and scattered by a bottom surface Fb of the container F in a state in which the container F is disposed above the sensor 45 as illustrated in FIG. 7B. The sensor is communicably connected to the purge controller 34, and supplies the detection result to the purge controller 34. The purge controller 34 controls the flow rate controller 33 based on the detection result of the sensor 45 to blow the purge gas G1 through the purge nozzle 31. In this manner, by using the detection result of the sensor 45, the timing for starting the blowing of the purge gas G1 can be determined without using the conveyance information or the operation information described above with reference to FIG. 3 or FIGS. 4A and 4B. Furthermore, the timing for starting the blowing of the purge gas G1 may be determined by using the detection result of the sensor 45 and at least one of the conveyance information and the operation information in combination. Note that the sensor 45 may be able to measure the distance to the bottom surface Fb of the container F for example with a laser range finder. The use of the measurement result of this sensor 45 enables the value of the gap GA to be determined, thus enabling the blowing of the purge gas G1 to be controlled in accordance with the value of the gap GA.

In the above-mentioned preferred embodiments, the purge controller 34 preferably includes, for example, a computer system. The purge controller 34 reads a control program stored in a storage device (not shown), and executes various kinds of processing in accordance with the control program. For example, the control program causes a computer to execute control of blowing a gas through a nozzle that is able to blow a gas in a state in which the nozzle faces the bottom surface Fb of the container F to be purged. The control program may be recorded and provided in a computer readable storage medium.

Note that, in the above-mentioned preferred embodiments, the purge nozzle 31 is used as a nozzle that blows a gas toward a container F to be purged in a state in which the bottom surface Fb of the container F faces the nozzle, but this nozzle may be provided separately from the purge nozzle 31, and may be a nozzle dedicated for cleaning, for example. In this case, the gas to be blown through the nozzle may be a gas having the same composition as that of the purge gas G1, or may be a gas having a composition different from that of the purge gas G1 (for example, atmosphere gas or air). Note that, in the above-mentioned preferred embodiment, the purge gas G1 is blown when the gas introduction port 41 in the container F and the purge nozzle 31 are connected to each other, but the purge gas G1 may be blown through the purge nozzle 31 in the state in which the bottom surface Fb of the container F and the purge nozzle 31 face each other when the container F (gas introduction port 41) is being removed from the purge device 4 (purge nozzle 31). Also in this case, particles P are able to be removed from the bottom surface Fb of the container F and from the surroundings of the purge nozzle 31.

Note that, in the state in which the purge nozzle 31 faces the bottom surface Fb of the container F and the purge gas G1 is blown through the purge nozzle 31, the stacker crane 5 (conveyor) may move (vibrate) the container F in at least one of the horizontal direction and the vertical direction. For example, the stacker crane 5 may move the container F such that the bottom surface Fb of the container F is swept by the purge gas G1 through the purge nozzle 31.

Note that, in FIGS. 1A and 1B, the purge device 4 is provided to the storage shelf 3 in the purge stocker 1, but may be provided to another portion (for example, a loading and unloading port) of the purge stocker 1. Furthermore, in FIGS. 1A and 1B, the purge device 4 is provided to the purge stocker 1, but may be provided to a device different from the purge stocker 1. For example, the purge device 4 may be provided to any of a temporary storage for a ceiling conveyor (for example, overhead buffer (OHB), side track storage (STS), and under track storage (UTS)), a temporary storage for a processing device using contained matters in containers F (tool buffer), and a changer that changes the order of contained matters in containers F. As far as permitted by the applicable law, the contents of Japanese Patent Application No. 2015-158043 and all the documents cited in the above-mentioned preferred embodiments are incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A purge device comprising:

a purge nozzle that is able to blow a purge gas; and a controller configured to control the purge nozzle to blow the purge gas according to a program; wherein based on conveyance information of a container to be purged to a purge position, after conveyance of the container is started and before a gas introduction port provided on a bottom surface of the container and the purge nozzle are connected to each other, the controller controls the purge nozzle to start blowing the purge gas through the purge nozzle in a state in which the bottom surface of the container and the purge nozzle face each other and a gap between the bottom surface of the container and a top surface of the purge nozzle is such that the purge gas blown through the purge nozzle reaches the bottom surface of the container.

2. The purge device according to claim 1, wherein the purge nozzle is connected to the gas introduction port and supplies the purge gas to an inside of the container through the gas introduction port.

3. The purge device according to claim 1, wherein the controller is configured to control the purge nozzle to start blowing the purge gas through the purge nozzle in accordance with an operation of a transfer device that lowers the container from above the purge nozzle.

4. The purge device according to claim 1, wherein the controller is configured to control the purge nozzle to continue blowing the purge gas through the purge nozzle even after the gas introduction port in the container and the purge nozzle are connected to each other, and the purge gas is supplied to the inside of the container.

5. The purge device according to claim 4, wherein the controller is configured to change a flow rate of the purge gas before and after the gas introduction port in the container and the purge nozzle are connected to each other.

6. The purge device according to claim 1, wherein the controller is configured to control the purge nozzle to start blowing the purge gas in a state in which the gap between the bottom surface of the container and the top surface of the purge nozzle is such that the purge gas that has reached the bottom surface of the container is turned back by the bottom surface of the container and reaches surroundings of the purge nozzle.

7. A purge stocker comprising:

the purge device according to claim 1; and a shelf that holds the container purged by the purge device.

8. A cleaning method comprising:

blowing a purge gas through a purge nozzle that is able to blow the purge gas; wherein based on conveyance information of a container to be purged to a purge position, after conveyance of the container is started and before a gas introduction port provided on a bottom surface of the container and the purge nozzle are connected to each other, controlling the purge nozzle to start blowing the purge gas through the purge nozzle in a state in which the bottom surface of the container and the purge nozzle face each other and a gap between the bottom surface of the container and a top surface of the purge nozzle is such that the purge gas blown through the purge nozzle reaches the bottom surface of the container.

* * * * *